(12) United States Patent
Zaizen et al.

(10) Patent No.: US 11,329,084 B2
(45) Date of Patent: May 10, 2022

(54) IMAGING UNIT

(71) Applicant: SONY SEMICONDUCTOR SOLUTIONS CORPORATION, Kanagawa (JP)

(72) Inventors: Yoshifumi Zaizen, Kanagawa (JP); Shunsuke Maruyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/960,801

(22) PCT Filed: Dec. 12, 2018

(86) PCT No.: PCT/JP2018/045705
§ 371 (c)(1),
(2) Date: Jul. 8, 2020

(87) PCT Pub. No.: WO2019/146299
PCT Pub. Date: Aug. 1, 2019

(65) Prior Publication Data
US 2021/0066372 A1 Mar. 4, 2021

(30) Foreign Application Priority Data

Jan. 23, 2018 (JP) .............................. JP2018-008583

(51) Int. Cl.
*H01L 27/146* (2006.01)
*H01L 23/00* (2006.01)

(52) U.S. Cl.
CPC ........ *H01L 27/14623* (2013.01); *H01L 24/29* (2013.01); *H01L 24/32* (2013.01); *H01L 27/14649* (2013.01); *H01L 2224/29005* (2013.01); *H01L 2224/32225* (2013.01)

(58) Field of Classification Search
CPC .... H01L 27/14623; H01L 24/29; H01L 24/32
See application file for complete search history.

(56) References Cited

U.S. PATENT DOCUMENTS

| 6,043,550 | A | 3/2000 | Kuhara et al. |
| 9,111,830 | B1 | 8/2015 | Dixon |
| 2002/0003201 | A1 | 1/2002 | Yu |
| 2003/0155625 | A1 | 8/2003 | Kato et al. |
| 2013/0048838 | A1 | 2/2013 | Mori et al. |
| 2018/0219039 | A1 | 8/2018 | Uchida et al. |

FOREIGN PATENT DOCUMENTS

| BE | 1022761 B1 | 8/2016 |
| CA | 2319550 A1 | 8/1999 |
| CN | 1296645 A | 5/2001 |

(Continued)

OTHER PUBLICATIONS

Extended European Search Report of EP Application No. 18902105.8, dated Feb. 16, 2021, 06 pages.

(Continued)

*Primary Examiner* — Errol V Fernandes
(74) *Attorney, Agent, or Firm* — Chip Law Group

(57) ABSTRACT

An imaging unit includes a photoelectric conversion layer including a compound semiconductor and having a light incident surface, and a light shielding portion provided in an optical path of light incident on the light incident surface and shielding light having a wavelength of less than 450 nm.

15 Claims, 11 Drawing Sheets

(56) References Cited

FOREIGN PATENT DOCUMENTS

| | | |
|---|---|---|
| CN | 107851650 A | 3/2018 |
| EP | 1051752 A2 | 11/2000 |
| EP | 2560214 A1 | 2/2013 |
| JP | 05-347399 A | 12/1993 |
| JP | 06-077518 A | 3/1994 |
| JP | 2000-036615 A | 2/2000 |
| JP | 2000-180621 A | 6/2000 |
| JP | 2002-502120 A | 1/2002 |
| JP | 2003-243693 A | 8/2003 |
| JP | 2006-269735 A | 10/2006 |
| JP | 2006-344681 A | 12/2006 |
| JP | 2009-038157 A | 2/2009 |
| JP | 2011-222874 A | 11/2011 |
| JP | 2014-521216 A | 8/2014 |
| JP | 2017-028078 A | 2/2017 |
| KR | 10-2001-0040506 A | 5/2001 |
| TW | 201505162 A | 2/2015 |
| WO | 1999/039372 A2 | 8/1999 |
| WO | 2011/129031 A1 | 10/2011 |
| WO | 2017/013924 A1 | 1/2017 |

OTHER PUBLICATIONS

International Search Report and Written Opinion of PCT Application No. PCT/JP2018/045705, dated Mar. 12, 2019, 12 pages of ISRWO.

[FIG. 1]
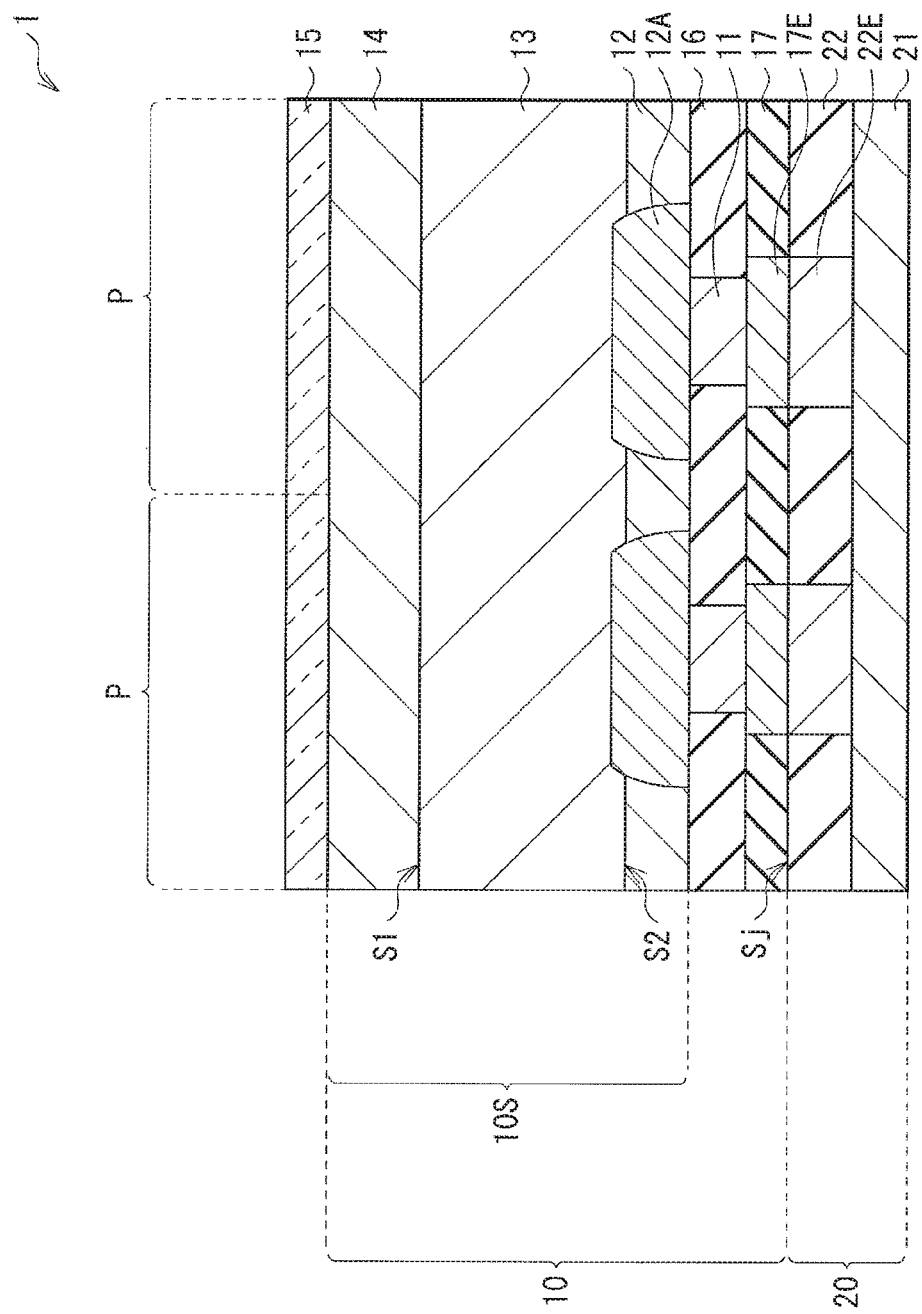

[FIG. 2]
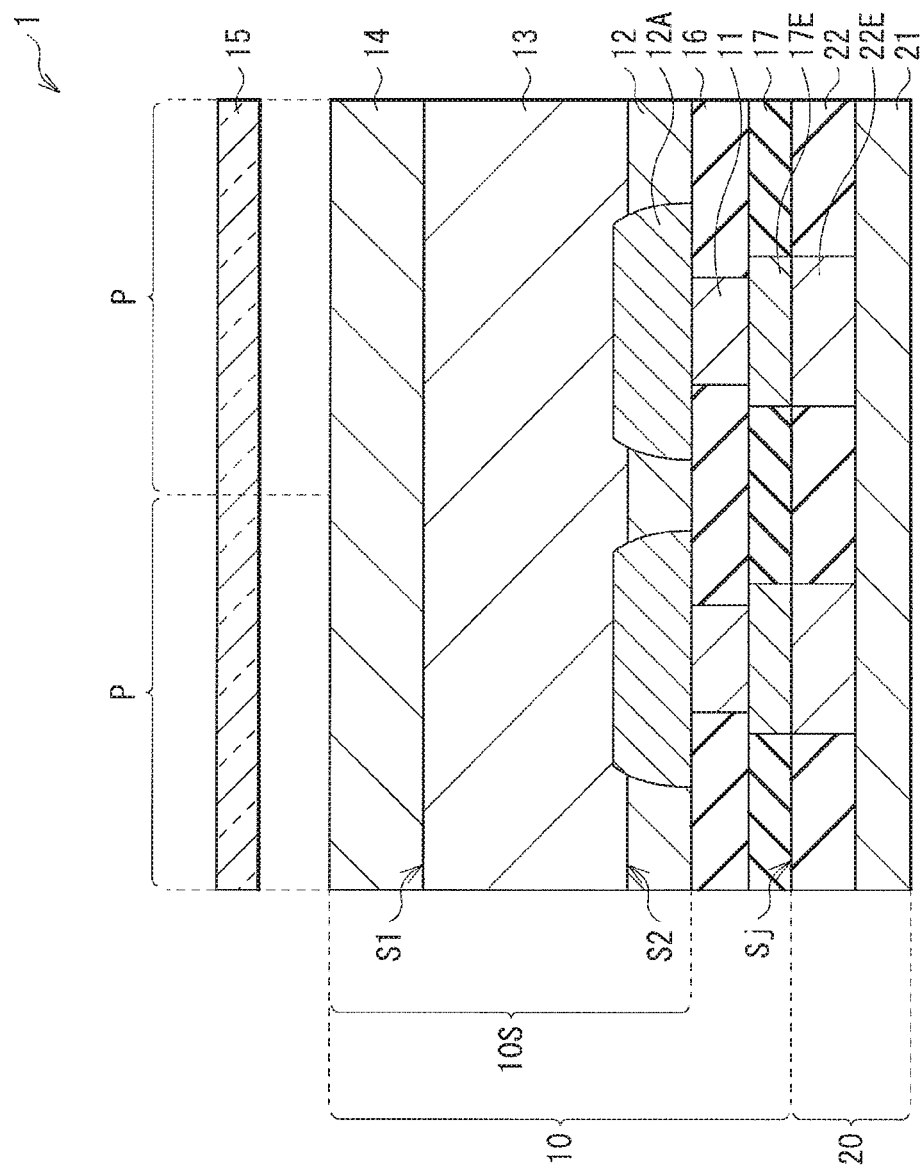

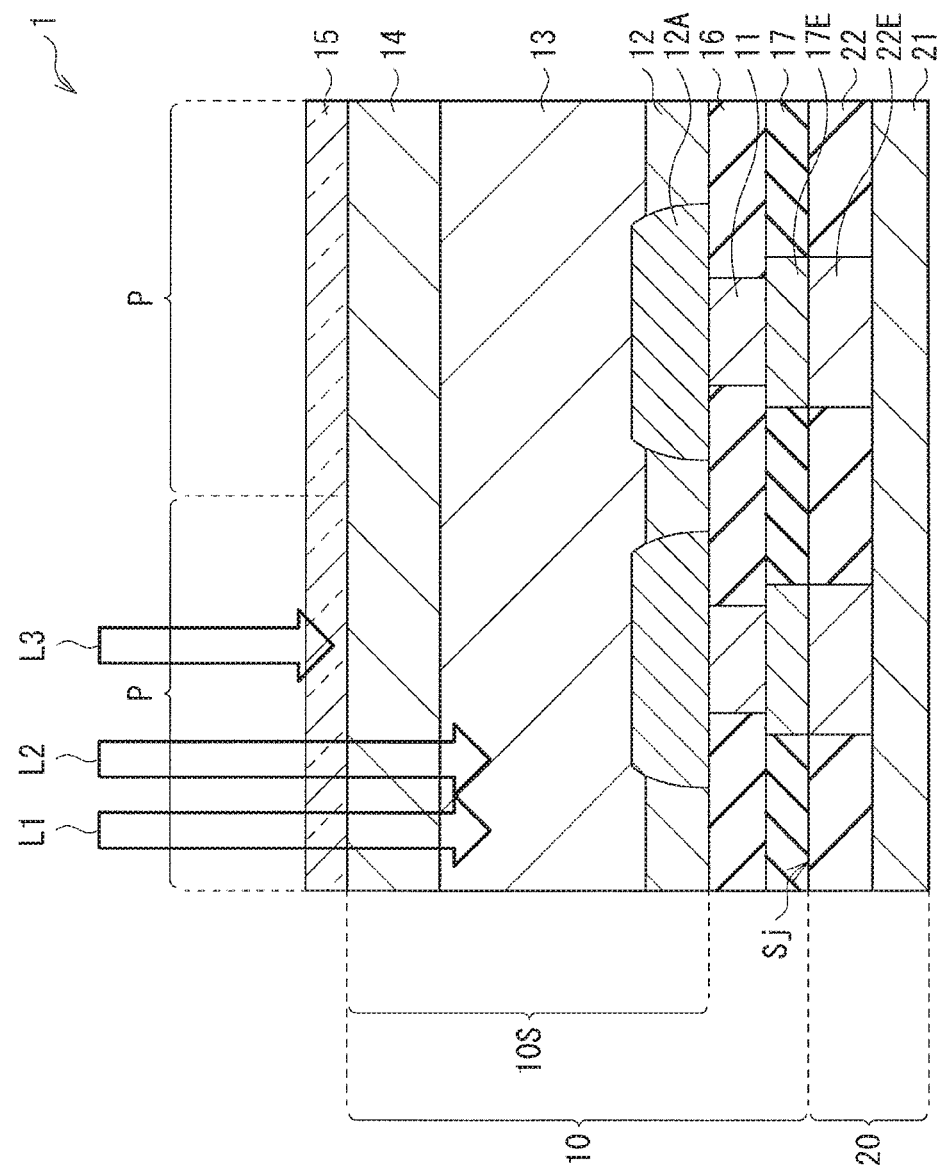
[FIG. 3]

[FIG. 4]
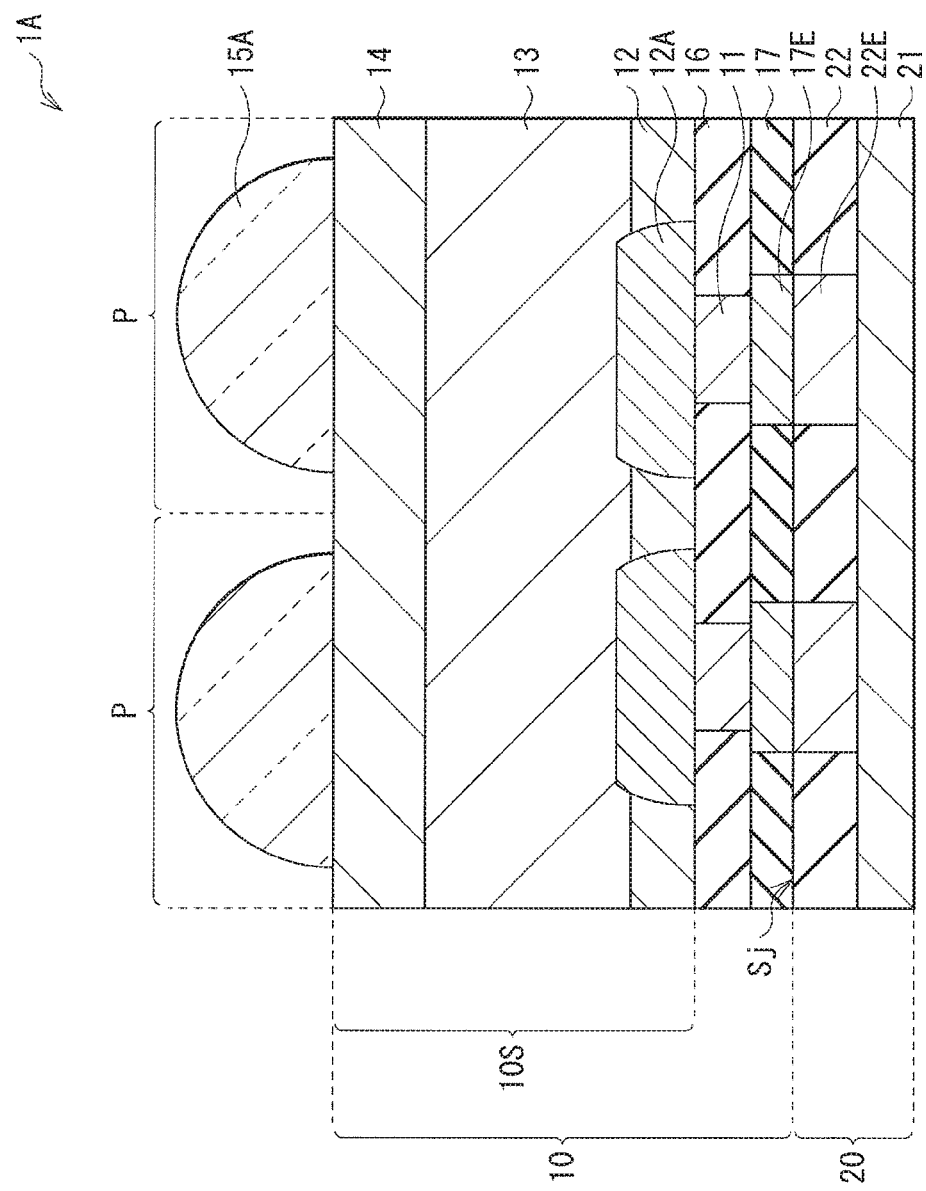

[FIG. 5]
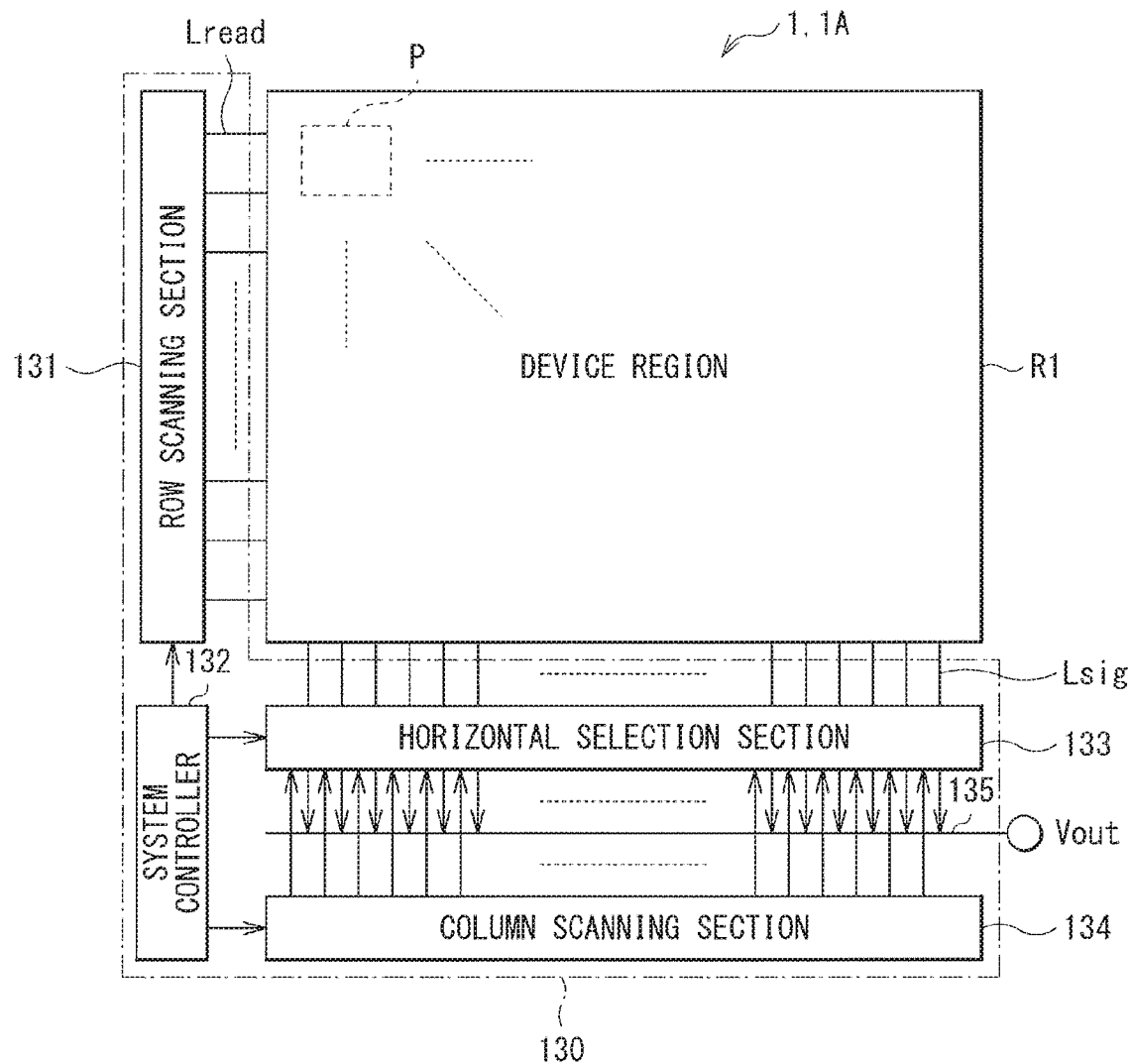
[FIG. 6]
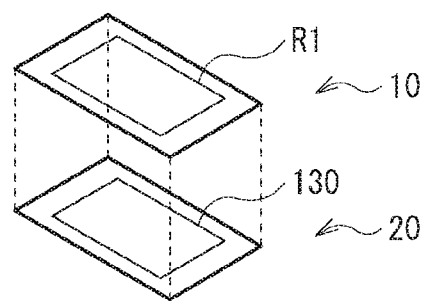

[FIG. 7]
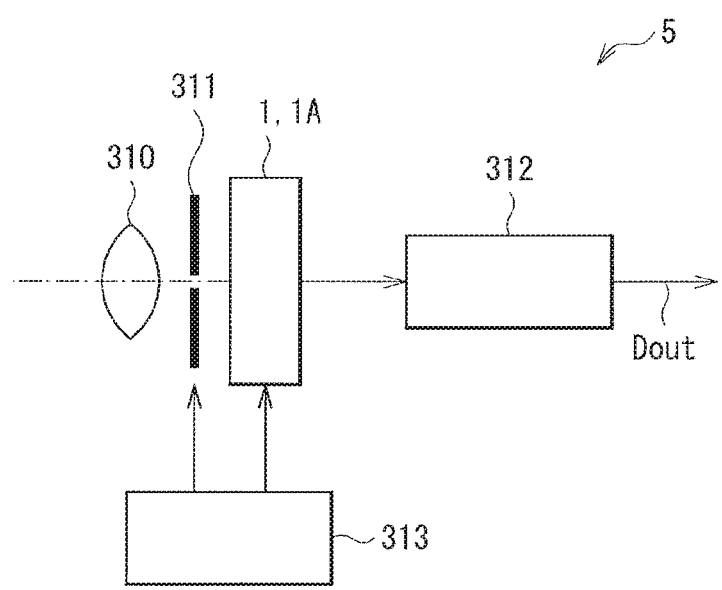

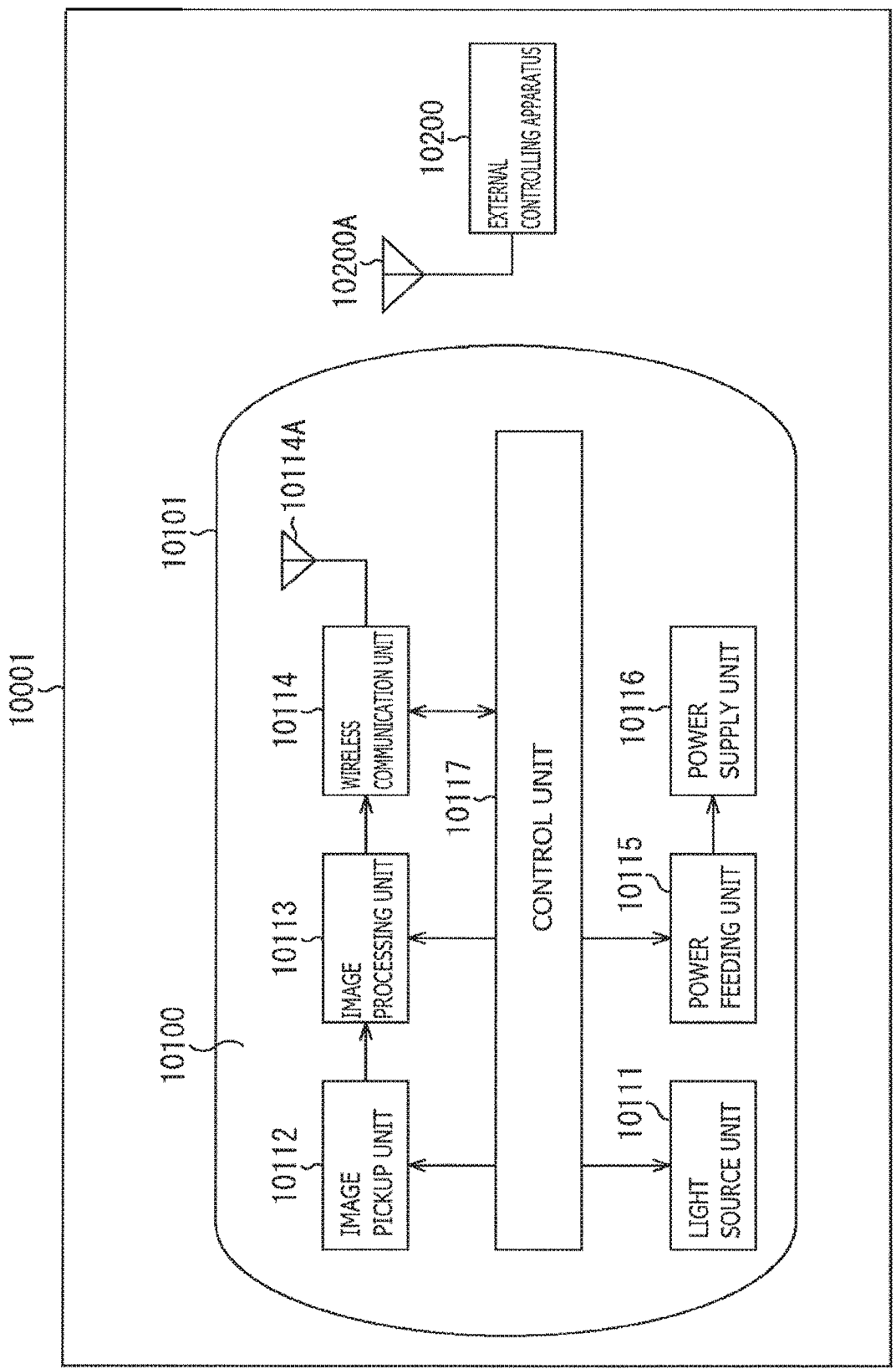

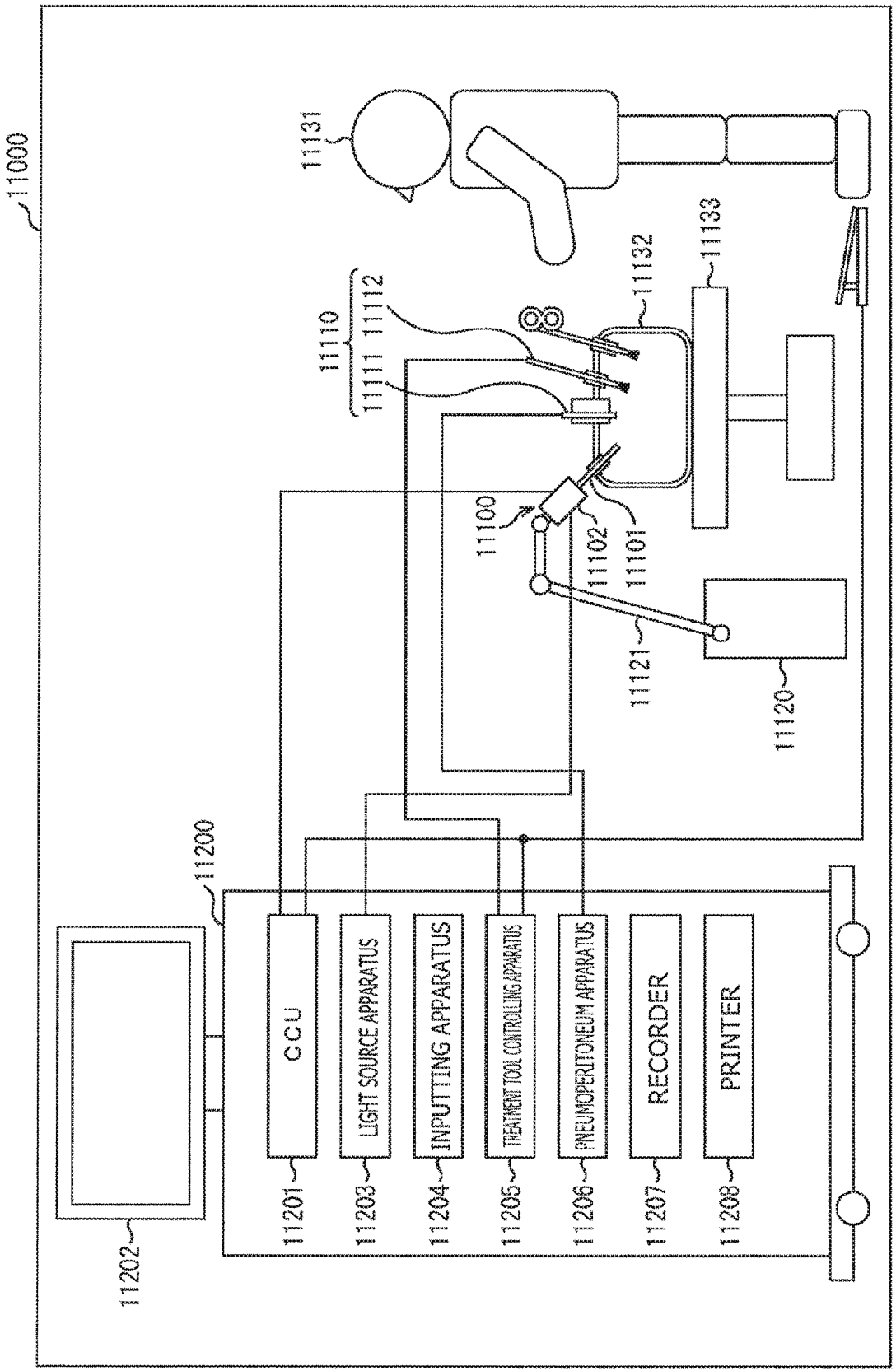
[FIG. 9]

[FIG. 10]
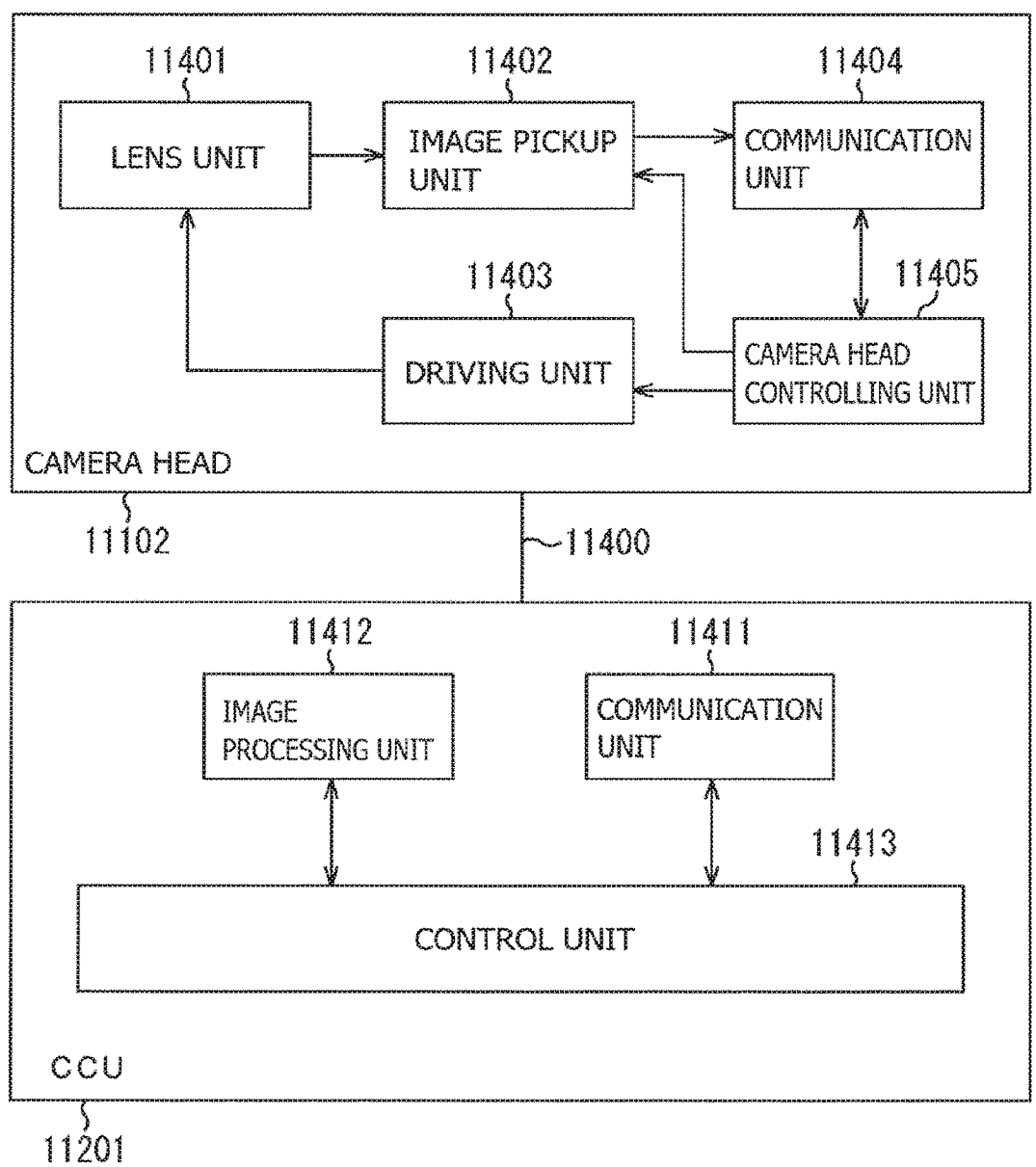

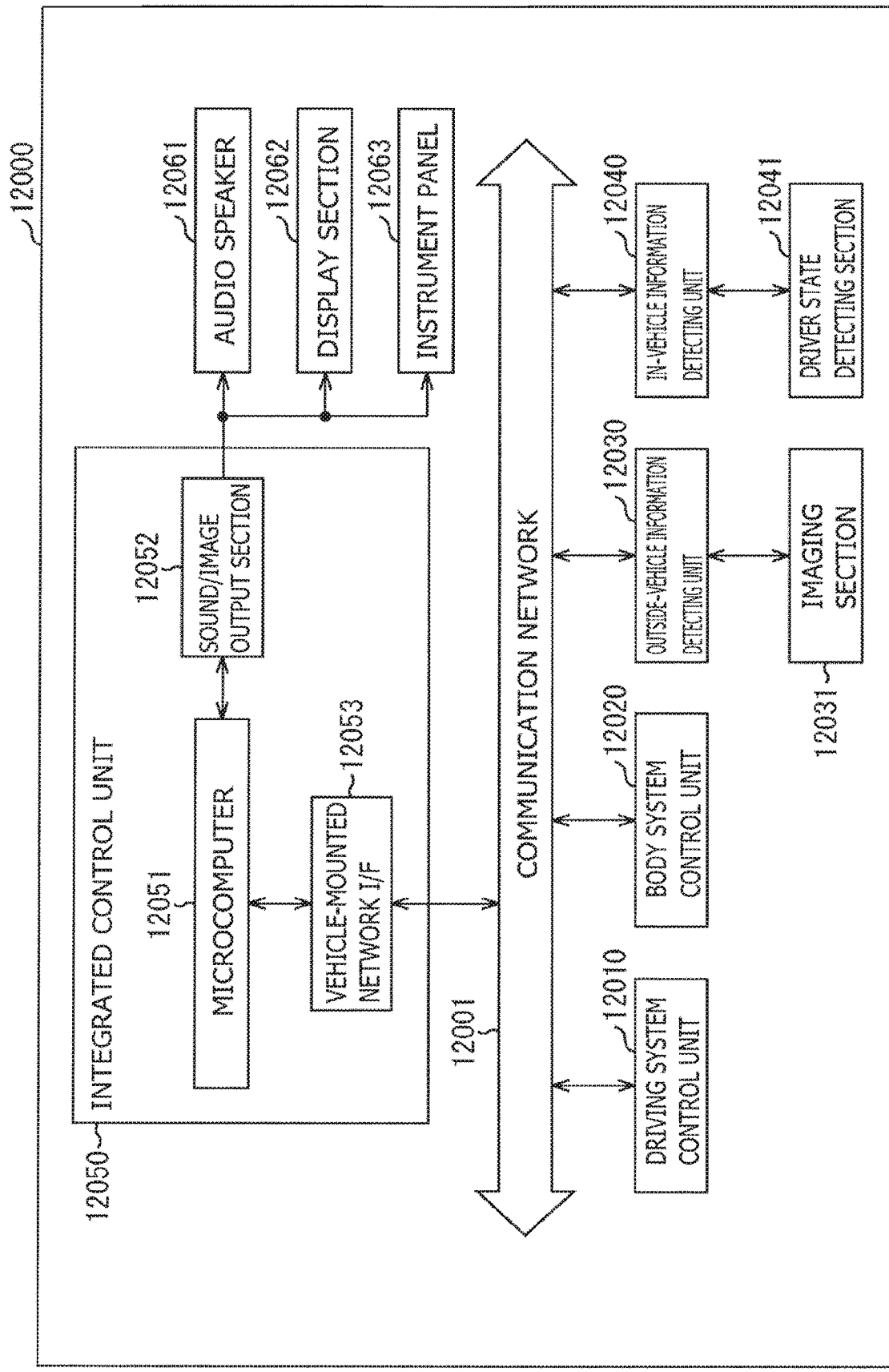
[FIG. 11]

[FIG. 12]
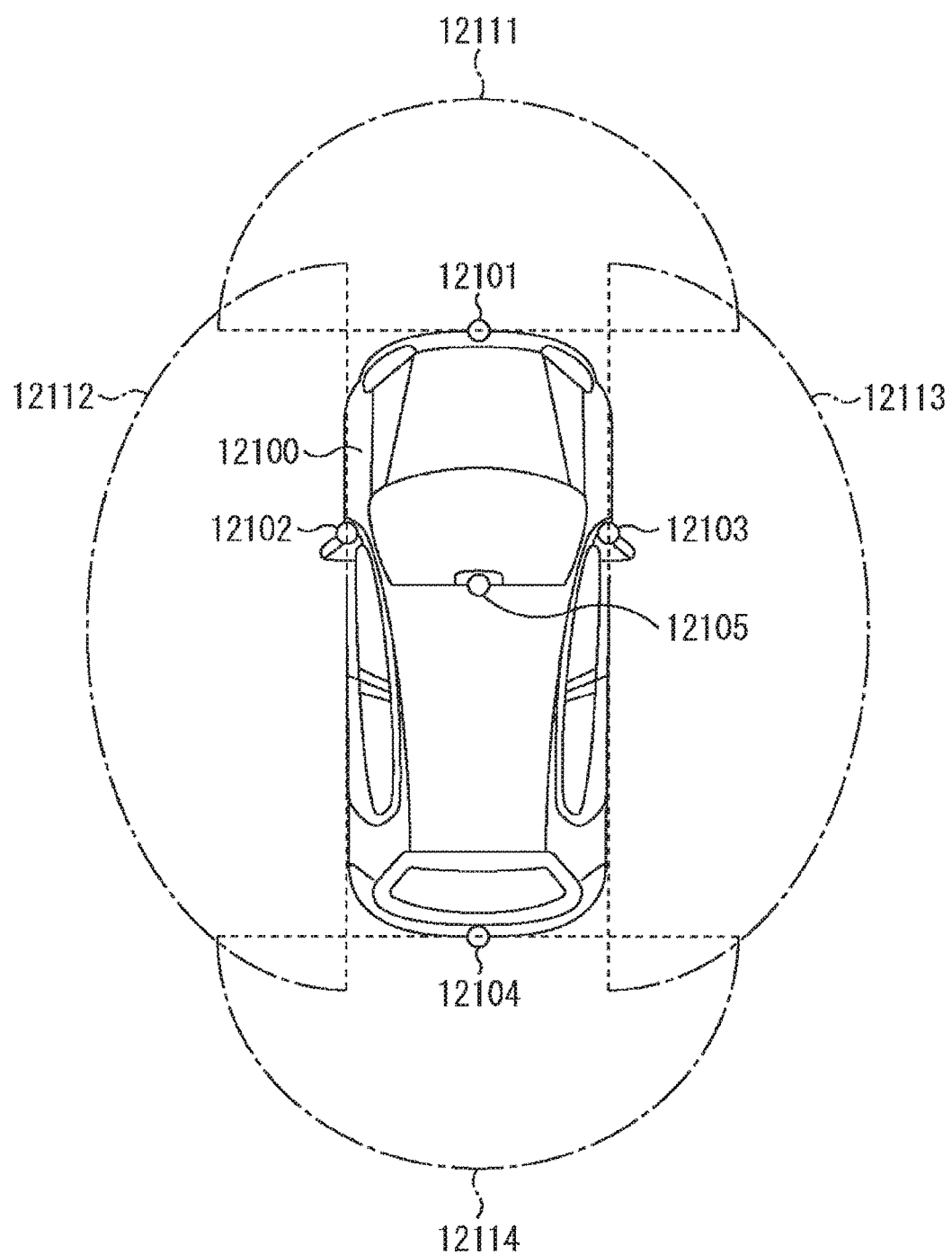

IMAGING UNIT

CROSS REFERENCE TO RELATED APPLICATIONS

This application is a U.S. National Phase of International Patent Application No. PCT/JP2018/045705 filed on Dec. 12, 2018, which claims priority benefit of Japanese Patent Application No. JP 2018-008583 filed in the Japan Patent Office on Jan. 23, 2018. Each of the above-referenced applications is hereby incorporated herein by reference in its entirety.

TECHNICAL FIELD

The present disclosure relates to an imaging unit that includes a photoelectric conversion layer including a compound semiconductor.

BACKGROUND ART

Recently, an image sensor (imaging unit) with sensitivity in an infrared region has been commercialized. This imaging unit uses a photoelectric conversion layer that includes a group III-V semiconductor such as InGaAs (indium gallium arsenide), for example. In this photoelectric conversion layer, charges are generated by absorbing infrared rays (photoelectric conversion is performed) as described in, for example, PTL 1.

CITATION LIST

Patent Literature

PTL 1: Japanese Translation of PCT International Application Publication No. 2014-521216

SUMMARY OF THE INVENTION

Such an imaging unit is desired to reduce noise.

Therefore, it is desirable to provide an imaging unit that enables reduction of noise.

An imaging unit (1) according to an embodiment of the present disclosure includes a photoelectric conversion layer and a light shielding portion. The photoelectric conversion layer includes a compound semiconductor and has a light incident surface. The light shielding portion is provided in an optical path of light incident on the light incident surface. The light shielding portion shields light having a wavelength of less than 450 nm.

An imaging unit (2) according to an embodiment of the present disclosure includes a photoelectric conversion layer and a light shielding portion. The photoelectric conversion layer includes a compound semiconductor and has a light incident surface. The light shielding portion is provided in an optical path of light incident on the light incident surface. The light shielding portion includes a compound lattice-matched with the photoelectric conversion layer.

In the imaging units (1) and (2) according to the embodiments of the present disclosure, since the light shielding portion is provided in the optical path of the light incident on the photoelectric conversion layer, unnecessary light including light having, for example, a wavelength in the ultraviolet region and the like is less likely to reach the photoelectric conversion layer.

According to the imaging units (1) and (2) of the embodiments of the present disclosure, the light shielding portion is provided in the optical path of light incident on the photoelectric conversion layer, thereby suppressing the occurrence of defects in the photoelectric conversion layer due to the light with high energy, including light having a wavelength in the ultraviolet region and the like, for example. This enables reduction of the noise.

It is to be noted that the above-described contents are examples of the present disclosure. Effects of the present disclosure are not limited to those described above, may be other different effects, or may further include other effects.

BRIEF DESCRIPTION OF THE DRAWINGS

FIG. 1 is a schematic cross-sectional view illustrating a configuration of a main part of an imaging unit according to an embodiment of the present disclosure.

FIG. 2 is a schematic cross-sectional view illustrating another example of a configuration of a light shielding portion illustrated in FIG. 1.

FIG. 3 is a schematic cross-sectional view for explaining a path of light entering the imaging unit illustrated in FIG. 1.

FIG. 4 is a schematic cross-sectional view illustrating a configuration of a main part of an imaging unit according to a modification example.

FIG. 5 is a block diagram illustrating an example of an entire configuration of the imaging unit illustrated in FIG. 1 and the like.

FIG. 6 is a schematic diagram illustrating an example of a configuration of a laminated imaging unit.

FIG. 7 is a functional block diagram illustrating an example of an electronic device (camera) using the imaging unit illustrated in FIG. 5.

FIG. 8 is a block diagram depicting an example of a schematic configuration of an in-vivo information acquisition system.

FIG. 9 is a view depicting an example of a schematic configuration of an endoscopic surgery system.

FIG. 10 is a block diagram depicting an example of a functional configuration of a camera head and a camera control unit (CCU).

FIG. 11 is a block diagram depicting an example of a schematic configuration of a vehicle control system.

FIG. 12 is a diagram of assistance in explaining an example of installation positions of an outside-vehicle information detecting section and an imaging section.

MODES FOR CARRYING OUT THE INVENTION

Hereinafter, embodiments of the present disclosure will be described in detail with reference to the drawings. It is to be noted that the description is given in the following order.
1. Embodiment (an example in which an imaging unit includes a light shielding portion)
2. Modification Example (an example in which a lens-shaped light shielding portion is provided)
3. Application Examples
4. Adaptation Examples

Embodiment

[Configuration]

FIG. 1 illustrates a schematic cross-sectional configuration of a main part of an imaging unit (imaging unit 1) according to an embodiment of the present disclosure. The imaging unit 1 is applied to, for example, an infrared sensor or the like using a compound semiconductor material, including a group III-V semiconductor and the like, for example. The imaging unit 1 has a photoelectric conversion function for light having, for example, a wavelength ranging from a visible region (e.g., of 380 nm or more and less than 780 nm) to a short infrared region (e.g., 780 nm or more and less than 2400 nm). The imaging unit 1 is provided with, for example, a plurality of light receiving unit regions P (pixels P) arranged two-dimensionally. FIG. 1 illustrates the cross-sectional configuration of a part corresponding to two pixels P.

The imaging unit 1 has a laminated structure including a device substrate 10 and a circuit board 20. A joint surface Sj is provided between the device substrate 10 and the circuit board 20. Light is incident on one surface of the device substrate 10 (a surface opposite to the joint surface Sj), whereby a signal charge is generated in a semiconductor layer of the device substrate 10 (a semiconductor layer 10S to be described later). The signal charge is read out by the circuit board 20 for each pixel P. The imaging unit 1 has a light shielding portion 15 on the one surface of the device substrate 10.

The device substrate 10 includes the semiconductor layer 10S. The semiconductor layer 10S includes, for example, a first contact layer 12, a photoelectric conversion layer 13, and a second contact layer 14 from the joint surface Sj side. The device substrate 10 includes an electrode 11 and a contact electrode 17E between the semiconductor layer 10S and the joint surface Sj. The semiconductor layer 10S and the circuit board 20 are electrically coupled to each other via the electrode 11 and the contact electrodes 17E. The electrode 11 is provided in a passivation film 16, while the contact electrode 17E is provided in an interlayer insulating film 17. The circuit board 20 includes a contact electrode 22E in contact with the contact electrode 17E (the device substrate 10), and a support substrate 21 opposed to the device substrate 10 with the contact electrode 22E in between. The contact electrode 22E is provided in an interlayer insulating film 22. The configuration of each component will be described below.

The interlayer insulating film 17 is provided, for example, in contact with the circuit board 20 to configure the joint surface Sj together with the interlayer insulating film 22. The contact electrode 17E is provided for each pixel P in the interlayer insulating film 17. The interlayer insulating film 17 includes, for example, an inorganic insulating material. Examples of this inorganic insulating material may include silicon nitride (SiN), aluminum oxide ($Al_2O_3$), silicon dioxide ($SiO_2$), hafnium dioxide ($HfO_2$), and the like.

The passivation film 16 is provided, for example, between the interlayer insulating film 17 and the first contact layer 12 (the semiconductor layer 10S). The electrode 11 that is electrically coupled to the contact electrode 17E is provided in the passivation film 16. The interlayer insulating film 17 includes, for example, an inorganic insulating material. Examples of this inorganic insulating material may include silicon nitride (SiN), aluminum oxide ($Al_2O_3$), silicon dioxide ($SiO_2$), hafnium dioxide ($HfO_2$), and the like. The passivation film 16 may include the same inorganic insulating material as the interlayer insulating film 17.

The electrode 11 is an electrode supplied with a voltage for reading out the signal charge generated in the photoelectric conversion layer 13 (a hole or an electron, which is hereinafter described for convenience assuming that the signal charge is a hole). The electrode 11 is provided separately for each pixel P. One end of the electrode 11 is in contact with the semiconductor layer 10S (more specifically, the first contact layer 12), while the other end of the electrode 11 is in contact with the contact electrode 17E. Adjacent electrodes 11 are electrically isolated by the passivation film 16.

The electrode 11 includes, for example, any one of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of them. The electrode 11 may be a single film of such a constituent material, or may be a laminated film including a combination of two or more kinds of these materials. For example, the electrode 11 includes a laminated film of titanium and tungsten.

The contact electrode 17E is directed to electrical coupling of the electrode 11 and the circuit board 20. One end of the contact electrode 17E is in contact with the electrode 11, while the other end of the contact electrode 17E is exposed at the joint surface Sj and is in contact with the contact electrode 22E. Adjacent contact electrodes 17E are electrically isolated by the interlayer insulating film 17. The contact electrode 17E includes, for example, a copper (Cu) pad.

The first contact layer 12, which is provided between the passivation film 16 and the photoelectric conversion layer 13, is provided, for example, in common to all the pixels P. The first contact layer 12 is opposed to the light shielding portion 15 with the photoelectric conversion layer 13 in between. The first contact layer 12 is directed to electrical isolation of adjacent pixels P. The first contact layer 12 is provided with, for example, a plurality of diffusion regions 12A. A compound semiconductor material having a bandgap larger than the bandgap of the compound semiconductor material included in the photoelectric conversion layer 13 is used in the first contact layer 12, thereby also enabling suppression of a dark current. It is possible to use, for example, an n-type InP (indium phosphorus) for the first contact layer 12. A thickness of the first contact layer 12 is between, for example, 100 nm and 500 nm.

The diffusion regions 12A provided in the first contact layer 12 are disposed apart from each other. The diffusion region 12A is disposed for each pixel P, and the electrode 11 is coupled to a corresponding one of the diffusion regions 12A. The diffusion region 12A is directed to reading out of the signal charge generated in the photoelectric conversion layer 13 for each pixel P. The diffusion region 12A includes, for example, a p-type impurity. Examples of the p-type impurity may include Zn (zinc) and the like. In this way, a pn junction interface is formed between the diffusion region 12A and a portion of the first contact layer 12 other than the diffusion region 12A, causing the adjacent pixels P to be electrically isolated from each other. The diffusion region 12A is provided, for example, in a thickness direction of the first contact layer 12 and also provided in a portion of the photoelectric conversion layer 13 in a thickness direction thereof.

The photoelectric conversion layer 13 provided between the first contact layer 12 and the second contact layer 14 has a first surface S1 (light incident surface) and a second surface S2 which face each other. The second contact layer 14 is provided on the first surface S1 of the photoelectric conversion layer 13, while the first contact layer 12 is provided on the second surface S2 of the photoelectric conversion layer 13. The photoelectric conversion layer 13 is provided, for example, in common to all the pixels P. The photoelectric conversion layer 13 absorbs light with a predetermined wavelength to generate a signal charge. The photoelectric conversion layer 13 include, for example, a compound semiconductor material such as an i-type group III-V semiconductor. Examples of the compound semiconductor material included in the photoelectric conversion layer 13 may include InGaAs (indium gallium arsenide), InAsSb (indium arsenide antimonide), InAs (indium arsenide), InSb (indium antimonide), PbS (lead sulfide), PbSe (lead selenide), GeAu (germanium gold), HgCdTe (mercury cadmium telluride), and the like. The photoelectric conversion layer 13 may include germanium (Ge). The photoelectric conversion layer 13 performs photoelectric conversion of light having, for example, a wavelength ranging from the visible region to the short infrared region. A thickness of the photoelectric conversion layer 13 is between, for example, 3000 nm and 10000 nm.

The second contact layer 14 is provided, for example, in common to all the pixels P. The second contact layer 14 is opposed to the first contact layer 12 with the photoelectric conversion layer 13 in between. The second contact layer 14 is a region where charges not used as signal charges, out of the charges generated in the photoelectric conversion layer 13, are moved. The second contact layer 14 includes, for example, a compound semiconductor containing an n-type impurity. For example, in a case where a hole is read out of the electrode 11 as the signal charge, an electron moves to the second contact layer 14. An electrode for discharging the charge may be coupled to the second contact layer 14. It is possible to use, for example, an n-type InP (indium phosphide) for the second contact layer 14. A thickness of the second contact layer 14 is, for example, between 10 nm and 400 nm, and preferably 100 nm or less. By reducing the thickness of the second contact layer 14, the amount of light absorbed in the second contact layer 14 is decreased, making it possible to improve the sensitivity of the photoelectric conversion layer 13. For example, in this imaging unit 1, the device substrate 10 and the circuit board 20 are coupled by CuCu bonding (to be described later). Thus, it is possible to reduce the thickness of the second contact layer 14 compared with a case where another joint method such as bump bonding is used, for example. This is because the CuCu bonding reduces the mechanical strength required for the second contact layer 14, compared with other joint methods.

The imaging unit 1 of the present embodiment includes the light shielding portion 15 in the optical path of the light incident on the first surface S1 of the photoelectric conversion layer 13. Specifically, the light shielding portion 15 is opposed to the photoelectric conversion layer 13 with the second contact layer 14 in between. The light shielding portion 15 shields light having a wavelength of, for example, less than 450 nm. As will be described in detail later, by providing this light shielding portion 15 in the optical path of the light incident on the photoelectric conversion layer 13, unnecessary light including light having, for example, a wavelength in the ultraviolet region and the like is less likely to reach the photoelectric conversion layer 13 even when the thickness of the second contact layer 14 is reduced.

The light shielding portion 15 is, for example, in contact with the second contact layer 14 and is provided in the form of film on an entire surface of the second contact layer 14. For example, this light shielding portion 15 transmits light having a wavelength ranging from the visible region to the short infrared region (light photoelectrically converted in the photoelectric conversion layer 13) and shields light having a wavelength of 450 nm or less. The light shielding portion 15 may reflect or absorb light having a wavelength of, for example, less than 450 nm.

The light shielding portion 15 includes, for example, a compound lattice-matched with the second contact layer 14 and the photoelectric conversion layer 13. Examples of the constituent material of such a light shielding portion 15 may include $In_xGa_yAs_zP_{(1-x-y-z)}$, $In_xGa_yAl_zAs_{(1-x-y-z)}$, $In_xGa_yAs_zSb_{(1-x-y-z)}$, InP, $In_xAl_yAs_zSb_{(1-x-y-z)}$, $In_xAl_yGa_zN_{(1-x-y-z)}$, or $Zn_xCd_ySe_z$ ($0 \leq x \leq 1$, $0 \leq y \leq 1$, $0 \leq z \leq 1$) and the like. It is possible to form this light shielding portion 15 by epitaxially growing the above-described compound on the second contact layer 14, for example.

The light shielding portion 15 may include a material other than the above-described compound. The light shielding portion 15 may include an inorganic material such as silicon oxide ($SiO_2$), silicon nitride (SiN), a high dielectric constant insulating film (High-k film), or the like. The light shielding portion 15 may include an organic material, such as an acrylic material. Alternatively, the light shielding portion 15 may include a metal material, such as ITO (Indium Tin Oxide), or IZO (Indium Zinc Oxide). When depositing the light shielding portion 15, it is preferable to suppress the incidence of light having a wavelength in the ultraviolet region onto the photoelectric conversion layer 13.

A thickness of the light shielding portion 15 is preferably set to a sufficient dimension in consideration of the wavelength ($\lambda$) of the shielded light, an extinction coefficient (k) of the constituent material of the light shielding portion 15, and the like. A penetration depth (z) is determined by using, for example, the Lambert-Beer law (the following formulas (1) and (2)). It is preferable that the light shielding portion 15 have a larger value of the penetration depth than this penetration depth z.

[Formula 1]
$$I = I_0 \exp^{-\alpha z} \quad (1)$$

[Formula 2]
$$\alpha = \frac{4\pi k}{\lambda} \quad (2)$$

In the formulas (1) and (2), I is an intensity of light at the penetration depth z, $I_0$ is an intensity of light incident on the light shielding portion 15, z is the penetration depth of the light incident on the light shielding portion 15, $\alpha$ is a coefficient of absorption of the light shielding portion 15, $\lambda$ is a wavelength of light incident on the light shielding portion 15, and k is an extinction coefficient of the light shielding portion 15.

For example, when the light shielding portion 15 includes an InP film, an extinction coefficient (k) of InP is substituted into the formula (2), and the wavelength ($\lambda$) of light incident on the light shielding portion 15 is 400 nm or less. From a value of the penetration depth (z) at this time, it is found that when the light shielding portion 15 includes an InP film, the light shielding portion 15 with a thickness of about 20 nm effectively shields the light with high energy.

As illustrated in FIG. 2, the light shielding portion 15 may be provided apart from the second contact layer 14. For example, an optical component provided in an optical path of light incident on the first surface S1 of the photoelectric conversion layer 13 may configure the light shielding portion 15. Examples of this optical component may include a lens, a prism, a mirror, a window, or the like. The optical component configuring this light shielding portion 15 include, for example, optical glass, magnesium fluoride ($MgF_2$), zinc selenide (ZnSe), zinc sulfide (ZnS), quartz, or the like. The light shielding portion 15 may have a lens shape or the like, and an opening or the like may be provided in the light shielding portion 15.

The support substrate 21 of the circuit board 20 is directed to supporting of the interlayer insulating film 22. The support substrate 21 includes, for example, silicon (Si). The interlayer insulating film 22 provided between the support substrate 21 and the device substrate 10 (joint surface Sj) includes, for example, an inorganic insulating material. Examples of this inorganic insulating material may include silicon nitride (SiN), aluminum oxide ($Al_2O_3$), silicon dioxide ($SiO_2$), hafnium dioxide ($HfO_2$), and the like. The contact electrode 22E is provided for each pixel P in the interlayer insulating film 22. A pixel circuit (not illustrated) electrically coupled to the contact electrode 22E may be provided in the interlayer insulating film 22. This pixel circuit configures an ROIC (read out integrated circuit).

The contact electrode 22E is directed to electrical coupling of the electrode 11 and the pixel circuit. One end of the contact electrode 22E is exposed at the joint surface Sj and is in contact with the contact electrode 17E. Adjacent contact electrodes 22E are electrically isolated by the interlayer insulating film 22. The contact electrode 22E is, for example, a copper (Cu) pad. That is, in the imaging unit 1, for example, the CuCu bonding is performed between the contact electrode 17E and the contact electrode 22E.

[Operation of Imaging Unit 1]

In the imaging unit 1, light (for example, light with wavelengths in the visible region and the infrared region) incident on the photoelectric conversion layer 13 through the light shielding portion 15 and the second contact layer 14 is absorbed in the photoelectric conversion layer 13. Consequently, a pair of a hole and an electron is generated (the photoelectric conversion is performed) in the photoelectric conversion layer 13. At this time, for example, when a predetermined voltage is applied to the electrode 11, a potential gradient occurs in the photoelectric conversion layer 13. Thus, one of the generated charges (for example, a hole) is moved to the diffusion region 12A as the signal charge and then collected from the diffusion region 12A into the electrode 11. The signal charge is moved to the pixel circuit through the contact electrodes 17E and 22E and then read out for each pixel P.

[Operation and Effect of Imaging Unit 1]

FIG. 3 schematically illustrates the path of light incident on the imaging unit 1 (light L1, L2, and L3). The imaging unit 1 of the present embodiment includes the light shielding portion 15 in the optical path of the light incident on the first surface S1 of the photoelectric conversion layer 13. The light shielding portion 15 shields light including the light (the light L3) having, for example, a wavelength in the ultraviolet region. Meanwhile, the light (the light L1) having a wavelength in the infrared region and the light (the light L2) having a wavelength in the visible region pass through the light shielding portion 15 and enter the photoelectric conversion layer 13 from the first surface S1. In the imaging unit 1, it is possible to improve the sensitivity of the photoelectric conversion layer 13 by reducing the thickness of the second contact layer 14, and to reduce noise by the light shielding portion 15. This will be described below.

For example, in the imaging unit 1 provided by coupling the device substrate 10 and the circuit board 20 through the CuCu bonding, it is possible to reduce the thickness of the second contact layer 14 to 100 nm or less. By reducing the thickness of the second contact layer 14, the amount of light L1 and L2 absorbed in the second contact layer 14 is decreased, and thus a much more amount of the light L1 and L2 are photoelectric-converted in the photoelectric conversion layer 13. In other words, the imaging unit 1 makes it possible to improve the sensitivity of the photoelectric conversion layer 13.

However, unnecessary light such as the light L3 is also more likely to penetrate the photoelectric conversion layer 13 due to such improvement in the sensitivity of the photoelectric conversion layer 13. As is apparent from the following formula (3) representing the energy (E) of light, the shorter the wavelength ($\lambda$) of light the larger the energy (E) of light becomes. Therefore, the light L3 has larger energy than each of the light L1 and L2. When this light L3 with the high energy reaches the photoelectric conversion layer 13, crystal defects may be generated in the photoelectric conversion layer 13 and become a noise source.

[Formula 3]

$$E[J]=hv=hc/\lambda[J] \qquad (3)$$

In the formula (3), h is a Planck constant, which is $6.62607 \times 10^{-34}$ [Js], v is a frequency, c is a light speed in a vacuum, which is $2.99798 \times 10^8$ [m/s], and $\lambda$ is a wavelength [m] of an electromagnetic wave in a vacuum.

In particular, crystal defects are more likely to be generated in the photoelectric conversion layer 13 including a compound semiconductor, compared with a photoelectric conversion layer formed of silicon (Si). In a silicon semiconductor, crystal defects are generated by penetration of atoms between lattices, whereas in a compound semiconductor containing binary or higher elements, crystal defects are generated by substitution (inverse substitution) of an element. This is because a formation energy of crystal defects in this compound semiconductor is smaller than a formation energy of crystal defects in the silicon semiconductor.

In order to cope with this problem of the noise source due to the light with high energy including the light L3 and the like, the imaging unit 1 is provided with the light shielding portion 15, and thereby unnecessary light such as the light L3 is less likely to reach (penetrate) the photoelectric conversion layer 13. Therefore, the imaging unit 1 suppresses occurrence of crystal defects due to the light with the high energy such as the light L3 even when the thickness of the second contact layer 14 is reduced. This enables reduction of noise.

As described above, in the imaging unit 1 of the present embodiment, the light shielding portion 15 is provided in the optical path of the light (the light L1 and L2) incident on the photoelectric conversion layer 13. Therefore, the imaging unit 1 suppresses occurrence of defects in the photoelectric conversion layer 13 due to the light with the high energy including the light having, for example, a wavelength in the ultraviolet region (the light L3) or the like. This enables reduction of the noise.

Further, by coupling the device substrate 10 and the circuit board 20 through the CuCu bonding, for example, it is possible to reduce the thickness of the second contact layer 14 provided at the first surface S1 of the photoelectric conversion layer 13. This makes it easier for the light L1 and L2 to reach the photoelectric conversion layer 13, thereby enabling improvement in the sensitivity of the imaging unit 1.

Further, by epitaxially growing the material of the light shielding portion 15 including the compound, on the second contact layer 14, for example, it is possible to form the light shielding portion 15. The formation of such a light shielding portion 15 is implementable with a simple method.

Although modification examples of the above-described embodiment will be described below, in the following description, the same constituent parts as those in the above-described embodiment are denoted by the same reference characters, and a description thereof will be omitted as appropriate.

Modification Examples

FIG. 4 schematically illustrates a cross-sectional configuration of a main part of an imaging unit (imaging unit 1A) according to a modification example of the above-described embodiment. The imaging unit 1A has a light shielding portion (a light shielding portion 15A) provided as an on-chip lens. Except for this point, the imaging unit 1A has the same configuration and effects as those of the imaging unit 1. [0045] The light shielding portion 15A is provided for each pixel P and has a lens shape. These light shielding portions 15A are provided at the first surface S1 of the photoelectric conversion layer 13 with the second contact layer 14 in between. The light shielding portions 15A may be provided in contact with the second contact layer 14. The light shielding portions 15A is provided in the optical path of light incident on the photoelectric conversion layer 13 and shields light having, for example, a wavelength of less than 450 nm.

The light shielding portion 15A has a light shielding function for light having, for example, a wavelength in the ultraviolet region or the like, and serves as the on-chip lens. That is, the light shielding portion 15A is configured to collect the light incident on the imaging unit 1A (the light with wavelengths in the infrared region and the visible region) into the photoelectric conversion layer 13. The light shielding portion 15A includes, for example, an organic material, an inorganic material such as silicon oxide ($SiO_2$), or the like.

As in the present modification example, the light shielding portion 15A may have the light shielding function as well as the function serving as the on-chip lens. Also in this case, effects similar to those in the above-described embodiment are available.

FIG. 5 illustrates an example of an entire configuration of each of the imaging units 1 and 1A described in the above embodiments and the like. Each of the imaging units 1 and 1A includes, for example, a device region R1 provided with a plurality of pixels P and a circuit section 130 that drives this device region R1. The circuit section 130 includes, for example, a row scanning section 131, a horizontal selection section 133, a column scanning section 134, and a system controller 132. [0049] The device region R1 has a plurality of pixels P (the imaging unit 1) arranged, for example, two-dimensionally in rows and columns. In the pixel P, for example, pixel drive lines Lread (for example, a row selection line and a reset control line) are wired for each pixel row, while vertical signal lines Lsig are wired for each pixel column. The pixel drive line Lread transmits a drive signal for reading out a signal from the pixel P. One end of the pixel drive line Lread is coupled to an output terminal corresponding to each row of the row scanning section 131.

The row scanning section 131 includes a shift register, an address decoder, and the like. The row scanning section 131 is a pixel driving section that drives each pixel P in the device region R1, for example, for each row unit. A signal output from each pixel P on the pixel row selectively scanned by the row scanning section 131 is supplied to the horizontal selection section 133 through each of the vertical signal lines Lsig. The horizontal selection section 133 includes an amplifier, a horizontal selection switch, and the like provided for each vertical signal line Lsig.

The column scanning section 134 includes a shift register, an address decoder, and the like. The column scanning section 134 sequentially scans and drives the respective horizontal selection switches in the horizontal selection section 133. By selectively scanning this column scanning section 134, the signal of each pixel transmitted through each of the vertical signal lines Lsig is sequentially output to a horizontal signal line 135 and then input to a non-illustrated signal processor or the like through the horizontal signal line 135.

As illustrated in FIG. 6, for example, the device substrate 10 having the device region R1 and the circuit board 20 having the circuit section 130 are laminated in each of the imaging units 1 and 1A. It is to be noted that the imaging units 1 and 1A are not limited to such a configuration and the circuit section 130 may be formed on the same substrate as the device region R1 or disposed in an external control IC. The circuit section 130 may be formed on another substrate coupled thereto by a cable or the like.

The system controller 132 receives a clock supplied from the outside, data about an instruction of an operation mode, and the like, and outputs data including internal information regarding the imaging unit 1 or 1A and the like. The system controller 132 further includes a timing generator that generates various timing signals, and performs driving control of the row scanning section 131, the horizontal selection section 133, the column scanning section 134, and the like based on various timing signals generated by the timing generator.

Application Examples

The imaging units 1 and 1A described above may be applied to various types of electronic devices, such as a camera capable of imaging in the infrared region, for example. FIG. 7 illustrates a schematic configuration of an electronic device 5 (a camera) as an example. The electronic device 5 is, for example, a camera capable of taking a still image or a video. The electronic device 5 includes the imaging unit 1 or 1A, an optical system (an optical lens) 310, a shutter device 311, a driving section 313 that drives the imaging unit 1 or 1A and the shutter device 311, and a signal processor 312.

The optical system 310 guides an image light (an incident light) from a subject to the imaging unit 1 or 1A. The optical system 310 may include a plurality of optical lenses. The shutter device 311 controls a light irradiation period and a light shielding period to the imaging unit 1 or 1A. The driving section 313 controls a transfer operation of the imaging unit 1 or 1A and a shutter operation of the shutter device 311. The signal processor 312 performs various types of signal processing on a signal output from the imaging unit 1 or 1A. A video signal Dout obtained after the signal processing is stored in a storage medium such as a memory or outputted to a monitor or the like.

Adaptation Examples to In-Vivo Information Acquisition System

Further, the technology according to the present disclosure (the present technology) may be adapted to a variety of products. For example, the technology according to the present disclosure may be applied to an endoscopic surgery system.

FIG. 8 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 8, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR)

process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure is applicable has been described above. The technology according to the present disclosure is applicable to, for example, an imaging pickup unit 10112 out of the configuration described above. This improves the detection accuracy.

Adaptation Examples to Endoscopic Surgery System

The technology according to the present disclosure (the present technology) may be adapted to a variety of products. For example, the technology according to the present disclosure may be applied to an endoscopic surgery system.

FIG. 9 is a view depicting an example of a schematic configuration of an endoscopic surgery system to which the technology according to an embodiment of the present disclosure (present technology) can be applied.

In FIG. 9, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 10 is a block diagram depicting an example of a functional configuration of the camera head 11102 and the CCU 11201 depicted in FIG. 9.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applicable has been described above. The technology according to the present disclosure is applicable to, for example, the image pickup unit 11402 out of the configuration described above. This improves the detection accuracy.

Although the endoscopic surgery system has been described herein as an example, the technology according to the present disclosure may be applied to other systems such as a micrographic surgery system.

Adaptation Examples to Mobile Bodies

The technology according to the present disclosure may be adapted to a variety of products. For example, the technology according to the present disclosure may be implemented as an apparatus that is mounted on any type of mobile body such as an automobile, an electric vehicle, a hybrid electric vehicle, a motorcycle, a bicycle, a personal mobility, an airplane, a drone, a ship, a robot, a construction machine, and an agricultural machine (a tractor).

FIG. 11 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 11, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 11, an audio speaker 12061, a display section 12062, and an instrument panel 12063 are illustrated as the output device. The display section 12062 may, for example, include at least one of an on-board display and a head-up display.

FIG. 12 is a diagram depicting an example of the installation position of the imaging section 12031.

In FIG. 12, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 12 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 out of the configuration described above. By applying the technology according to the present disclosure to the imaging section 12031, a photographed image that is more visible is available, which makes it possible to reduce fatigue of a driver.

It is to be noted that although the present disclosure has been described with reference to the embodiments and the like, the contents of the present disclosure are not limited to the above-described embodiments and the like, and various modifications are implementable. For example, the configurations of layers in the imaging units 1 and 1A, which have been described in the above embodiments, are examples, and may further include other layers. The materials and thicknesses of the respective layers are also examples and are not limited to those described above. For example, the above-described embodiments and the like have described a case where the semiconductor layer 10S includes the first contact layer 12, the photoelectric conversion layer 13, and the second contact layer 14, but the semiconductor layer 10S only needs to include the photoelectric conversion layer 13. For example, the first contact layer 12 and the second contact layer 14 may not be provided, or other layers may be included.

Further, in the above-described embodiments and the like, a case where the signal charge is a hole has been described for convenience, but the signal charge may be an electron. For example, the diffusion region may include an n-type impurity.

Further, a plurality of light shielding portions 15 and 15A may be respectively provided in the imaging units 1 and 1A.

Further, the effects described in the above embodiments and the like are examples, may be other different effects, or may further include other effects.

The present disclosure may have the following configurations.

(1)

An imaging unit including:

a photoelectric conversion layer including a compound semiconductor, the photoelectric conversion layer having a light incident surface; and a light shielding portion provided in an optical path of light incident on the light incident surface, the light shielding portion shielding light having a wavelength of less than 450 nm.

(2)

The imaging unit according to (1) described above, in which the light shielding portion includes an inorganic material.

(3)

The imaging unit according to (1) described above, in which the light shielding portion includes an organic material.

(4)

The imaging unit according to (1) described above, in which the light shielding portion includes metal.

(5)

The imaging unit according to any one of (1) to (3) described above, in which the light shielding portion has a lens shape.

(6)

An imaging unit including:

a photoelectric conversion layer including a compound semiconductor, the photoelectric conversion layer having a light incident surface; and a light shielding portion provided in an optical path of light incident on the light incident surface, the light shielding portion including a compound lattice-matched with the photoelectric conversion layer.

(7)

The imaging unit according to (6) described above, in which the light shielding portion includes $In_xGa_yAs_zP_{(1-x-y-z)}$, $In_xGa_yAl_zAs_{(1-x-y-z)}$, $In_xGa_yAs_zSb_{(1-x-y-z)}$, InP, $In_xAl_yAs_zSb_{(1-x-y-z)}$, $In_xAl_yGa_zN_{(1-x-y-z)}$, or $Zn_xCd_ySe_z$ ($0 \leq x \leq 1$, $0 \leq y \leq 1$, $0 \leq z \leq 1$).

(8)

The imaging unit according to any one of (1) to (7) described above, in which the light shielding portion transmits light having a wavelength in an infrared region and light having a wavelength in a visible region.

(9)

The imaging unit according to any one of (1) to (8) described above, further including:

a first contact layer opposed to the light shielding portion with the photoelectric conversion layer in between; and a second contact layer opposed to the first contact layer with the photoelectric conversion layer in between.

(10)

The imaging unit according to (9) described above, in which the light shielding portion is provided in contact with the second contact layer.

(11)

The imaging unit according to (9) described above, in which the light shielding portion is provided apart from the second contact layer.

(12)

The imaging unit according to any one of (9) to (11) described above, in which the second contact layer has a thickness of 100 nm or less.

(13)

The imaging unit according to any one of (9) to (12) described above, further including:

a device substrate including the first contact layer, the photoelectric conversion layer, and the second contact layer; and a circuit board including a pixel circuit electrically coupled to the photoelectric conversion layer.

(14)

The imaging unit according to (13) described above, in which the device substrate and the circuit board are electrically coupled by Cu—Cu bonding.

(15)

The imaging unit according to any one of (1) to (14) described above, in which the compound semiconductor absorbs light having a wavelength in an infrared region.

(16)

The imaging unit according to any one of (1) to (15) described above, in which the compound semiconductor is one of InGaAs, InAsSb, InAs, InSb, PbS, PbSe, GeAu, and HgCdTe.

The present application claims the priority on the basis of Japanese Patent Application No. 2018-8583 filed on Jan. 23, 2018 with Japan Patent Office, the entire contents of which are incorporated in the present application by reference.

[0134] Those skilled in the art could assume various modifications, combinations, sub-combinations, and changes in accordance with design requirements and other contributing factors. However, it is understood that they are included within a scope of the attached claims or the equivalents thereof.

The invention claimed is:

1. An imaging unit, comprising:

a photoelectric conversion layer including a compound semiconductor, wherein the photoelectric conversion layer has a light incident surface; and a light shielding portion in an optical path of light incident on the light incident surface, wherein the light shielding portion is configured to shield light having a wavelength of less than 450 nm, and the light shielding portion includes $In_xGa_yAs_zP_{(1-x-y-z)}$, $In_xGa_yAl_zAs_{(1-x-y-z)}$, $In_xGa_yAs_zSb_{(1-x-y-z)}$, $In_xAl_yAs_zSb_{(1-x-y-z)}$, $In_xAl_yGa_zN_{(1-x-y-z)}$, or $Zn_xCd_ySe_z$ ($0 \leq x \leq 1$, $0 \leq y \leq 1$, $0 \leq z \leq 1$).

2. The imaging unit according to claim 1, wherein the light shielding portion includes an inorganic material.

3. The imaging unit according to claim 1, wherein the light shielding portion includes an organic material.

4. The imaging unit according to claim 1, wherein the light shielding portion includes metal.

5. The imaging unit according to claim 1, wherein the light shielding portion has a lens shape.

6. The imaging unit according to claim 1, wherein the light shielding portion is configured to transmit light having a wavelength in an infrared region and light having a wavelength in a visible region.

7. The imaging unit according to claim 1, further comprising:
a first contact layer opposed to the light shielding portion with the photoelectric conversion layer in between; and
a second contact layer opposed to the first contact layer with the photoelectric conversion layer in between.

8. The imaging unit according to claim 7, wherein the light shielding portion is in contact with the second contact layer.

9. The imaging unit according to claim 7, wherein the light shielding portion is provided apart from the second contact layer.

10. The imaging unit according to claim 7, wherein the second contact layer has a thickness of 100 nm or less.

11. The imaging unit according to claim 7, further comprising:
a device substrate including:
the first contact layer;
the photoelectric conversion layer; and
the second contact layer; and
a circuit board including a pixel circuit electrically coupled to the photoelectric conversion layer.

12. The imaging unit according to claim 11, wherein the device substrate and the circuit board are electrically coupled by Cu—Cu bonding.

13. The imaging unit according to claim 1, wherein the compound semiconductor is configured to absorb light having a wavelength in an infrared region.

14. The imaging unit according to claim 1, wherein the compound semiconductor is one of InGaAs, InAsSb, InAs, InSb, PbS, PbSe, GeAu, and HgCdTe.

15. An imaging unit, comprising:
a photoelectric conversion layer including a compound semiconductor, wherein the photoelectric conversion layer has a light incident surface; and
a light shielding portion in an optical path of light incident on the light incident surface, wherein
the light shielding portion includes a compound lattice-matched with the photoelectric conversion layer, and
the light shielding portion includes $In_xGa_yAs_zP_{(1-x-y-z)}$, $In_xGa_yAl_zAs_{(1-x-y-z)}$, $In_xGa_yAs_zSb_{(1-x-y-z)}$, $In_xAl_yAs_zSb_{(1-x-y-z)}$, $In_xAl_yGa_zN_{(1-x-y-z)}$, or $Zn_xCd_ySe_z$ ($0 \leq x \leq 1$, $0 \leq y \leq 1$, $0 \leq z \leq 1$).

* * * * *